United States Patent
Handy

(10) Patent No.: US 9,335,366 B2
(45) Date of Patent: May 10, 2016

(54) BUILT-IN TESTING OF AN ARC FAULT/TRANSIENT DETECTOR

(71) Applicant: GE Aviation Systems Limited, Cheltenham, Gloucestershire (GB)

(72) Inventor: Peter James Handy, Cheltenham (GB)

(73) Assignee: GE AVIATION SYSTEMS LIMITED, Cheltenham, Gloucestershire (GB)

( * ) Notice: Subject to any disclaimer, the term of this patent is extended or adjusted under 35 U.S.C. 154(b) by 104 days.

(21) Appl. No.: 14/336,214

(22) Filed: Jul. 21, 2014

(65) Prior Publication Data

US 2016/0041222 A1 Feb. 11, 2016

(30) Foreign Application Priority Data

Aug. 6, 2013 (GB) .................................... 1314079.3

(51) Int. Cl.
*G01R 31/3187* (2006.01)
*G01R 31/28* (2006.01)

(52) U.S. Cl.
CPC .................................. *G01R 31/2829* (2013.01)

(58) Field of Classification Search
CPC ........... G01R 31/2884; G01R 31/3004; G01R 31/31715; G01R 31/31701; G01R 31/025; G01R 31/02; G01R 31/2829; G01R 31/14; G01R 31/088; G01R 31/083; G01R 31/28; G01R 31/1272; G01R 31/1254; G01R 31/31924; G01R 31/31922; G01R 31/31937
USPC .............. 324/750.3, 511, 512, 521, 522, 531, 324/536, 537, 750.01; 361/42, 45, 49
See application file for complete search history.

(56) References Cited

U.S. PATENT DOCUMENTS

| | | | |
|---|---|---|---|
| 245,278 A | 8/1881 | Chisholm | |
| 5,459,630 A | 10/1995 | MacKenzie et al. | |
| 5,969,920 A | 10/1999 | MacKenzie | |
| 6,421,214 B1 * | 7/2002 | Packard | H02H 3/335 361/7 |
| 6,720,872 B1 | 4/2004 | Engel et al. | |
| 6,798,628 B1 * | 9/2004 | Macbeth | H02H 1/0015 361/42 |
| 7,633,728 B2 * | 12/2009 | Parker | H02H 1/0015 361/42 |
| 7,924,537 B2 * | 4/2011 | Mernyk | H02H 11/002 361/42 |
| 8,299,799 B2 * | 10/2012 | Finlay, Sr. | H01H 83/04 324/424 |
| 2003/0099070 A1 * | 5/2003 | Macbeth | H02H 1/0015 361/5 |
| 2010/0046129 A1 * | 2/2010 | Mikrut | H02H 9/005 361/45 |
| 2011/0292555 A1 | 12/2011 | Shipley | |

FOREIGN PATENT DOCUMENTS

| | | |
|---|---|---|
| GB | 1242400 A | 8/1971 |
| JP | 60185178 A | 9/1985 |

(Continued)

OTHER PUBLICATIONS

GB Search Report issued in connection with corresponding GB Application No. 1314079.3 on Jan. 10, 2014.

(Continued)

*Primary Examiner* — Son Le
*Assistant Examiner* — Thang Le
(74) *Attorney, Agent, or Firm* — GE Global Patent Operation; William S. Munnerlyn

(57) ABSTRACT

The present invention relates to built-in testing of detectors for the detection of electrical arc faults or transients, where the detector is integrated into or electrically coupled to an electrical power supply system.

18 Claims, 5 Drawing Sheets

(56) References Cited

FOREIGN PATENT DOCUMENTS

| | | | |
|---|---|---|---|
| JP | 2003317598 | A | 11/2003 |
| WO | 2012116722 | A1 | 9/2012 |

OTHER PUBLICATIONS

Unofficial English translation of Japanese Notice of Allowance issued in connection with corresponding JP Application No. 2014145509 on Sep. 15, 2015.

* cited by examiner

BUILT-IN TESTING OF AN ARC FAULT/TRANSIENT DETECTOR

TECHNICAL FIELD

Embodiments of the present invention relate to built-in testing of detectors for the detection of electrical arc faults or transients, where the detector is integrated into or electrically coupled to an electrical power supply system. Aspects of the invention also allow for reporting (to a user) an indication of the functional health of the detector resulting from the testing.

BACKGROUND ART

Electrical power supply systems are known which incorporate detectors adapted to detect and circumvent electrical arc faults or transients. Arc faults/transient events may manifest themselves as impulses of current and/or voltage in excess of the rating of individual components of the power supply system. Without intervention, such arc faults/transients are potentially damaging to wiring and downstream loads of the power supply system. The damage may not be confined to the power supply system directly experiencing the arc fault/transient event, but may propagate to other systems nearby (for example, due to an excessive heat build-up which can result from an arc fault/transient). Additionally, such arc fault/transient events are also hazardous to a user of the power supply system. For the purpose of this document, the terms "detector" and "arc fault/transient detector" are used interchangeably.

It is known for circuit breakers to be used in industrial and domestic applications to protect against the effects of electrical arc faults and transients, with the circuit breaker providing an automatically operated breaker switch designed to trip upon detection of a fault condition and thereby interrupt current flow to protect electrical components downstream of the circuit breaker from consequent damage. Known in the field of semi-conductors are solid state power controllers (SSPC). SSPC's are used for controlling voltage and/or current supplied to a load and incorporate circuitry for identifying overload conditions. In essence, an SSPC functions as a form of circuit breaker, incorporating a breaker switch and a detector for detecting an arc fault or transient and thereby acting to open ("trip") the breaker switch.

In the art outlined above, the ability to trip a breaker switch is dependent upon proper functioning of the arc fault/transient detector. Fault conditions in the detector can manifest themselves as a failure to detect the presence of the occurrence of an arc fault/transient, which may result in the breaker switch failing to trip and the risk of the load and the user being exposed to potentially dangerous electric current and voltage levels. Furthermore, as indicated above, there is a risk of the arc fault/transient event causing indirect damage and faults to adjacent systems. Detection failures can have disastrous safety implications; for example, in the case of an aircraft incorporating electrical power supply systems including such detectors and breaker switches to detect and nullify the effects of any arc faults/transients, failure to detect a fault and trip the flow of current from the power source would risk fire and loss of an aircraft. Fault conditions in a detector can also manifest themselves as indicating the presence of an arc fault/transient where no such arc fault/transient exists—the resulting tripping of the breaker switch is referred to herein as a "nuisance trip". It is highly desired for such nuisance trips to be avoided because they unnecessarily interrupt the continued operation of loads powered by the power source of the supply system. As well as being inconvenient, where such loads are themselves performing a safety function, such nuisance trips are potentially dangerous as they can lead to unscheduled outages during which the safety function is not available.

Whilst testing of an arc fault/transient detector prior to its installation and commissioning in an electrical power supply system is easy to achieve, such testing does not address any failures or errors in detector functioning which occur during and after installation and commissioning. Although it may be possible to remove a detector from the power supply system after commissioning to enable the detector to be tested away from the system, the removal would increase the duration for which the power supply system is out of use, with time required for removing the detector from the system, testing the detector and then reinstalling the detector within the system. Furthermore, in some applications such detectors may be located in inaccessible or hard to reach locations, thereby further increasing the amount of maintenance time required to remove the detector. An example of inaccessible or hard to reach locations is for electrical power supply systems used in aircraft, with such systems often installed in cramped environments and alongside multiple other aircraft systems.

Given these issues, there is a need for being able to verify correct functioning of an electric arc fault/transient detector without necessitating removal of the detector from an electrical power supply system of which it forms part.

BRIEF DESCRIPTION

Accordingly, a first aspect of the invention provides a method of verifying correct functioning of an arc fault/transient detector, the method including providing an electrical power supply system, wherein the system includes a circuit having: a power source for providing electric power to a load; a breaker switch provided in an electrically conductive path between the power source and the load, the breaker switch having an open position and a closed position; and a test switch provided between an output of the breaker switch and a ground to form a short circuit loop in the circuit, the test switch having an open position for breaking electrical continuity of the short circuit loop to the ground and a closed position for providing electrical continuity of the short circuit loop to the ground. The system further includes an arc fault/transient detector operable to monitor for a rate of change in one or both of a current or a voltage in the circuit, the detector co-operable with the breaker switch to trip the breaker switch from the closed position to the open position, if the sensed rate of change exceeds a predetermined value. The method further comprises selectively switching the test and breaker switches so as to: a) provide electrical continuity of the short circuit loop to the ground to thereby establish a short circuit between the output of the breaker switch and the ground, and thereafter either or both of: b) inject a flow of current from the power source into the short circuit; and/or c) terminate an injected flow of current from the power source into the short circuit. The method further comprising: monitoring, using the arc fault/transient detector, for a rate of change of either or both of a transient current or a transient voltage in the short circuit loop induced by the injecting/terminating of the flow of current from the power source into the short circuit; and determining a functional status of the detector based upon the monitoring, wherein faulty functioning of the detector corresponds to the following condition being met: the detector failing to detect the induced rate of change during monitoring.

It is envisaged that the detector would be electrically coupled to the circuit. The detector could be integrated into the circuit, meaning that it would be an integral part of the circuit of the electrical power supply system.

During normal operation of the electrical power supply system, the test switch would be in its open position and the breaker switch in its closed position, thereby enabling the power source to provide electric current to the load. Assuming the detector is functioning correctly, the occurrence of an arc fault/transient would be detected by the detector, with the detector then acting to trip the breaker switch to its open position and thereby terminate current flow from the power source to the load.

Embodiments of the present invention use the short circuit loop in the electrical power supply system and selective switching of the test and breaker switches for verifying correct functioning of the arc fault/transient detector. The power source of the electrical power supply system provides the system with an in-built power source, which can be used in conjunction with the selective switching of the test and breaker switches to induce a transient current/voltage into the short circuit loop. The induced transient current/voltage simulates the general effect of an arc fault/transient. Embodiments of the present invention avoid the need to couple an external power source to the system to induce the transient current/voltage necessary to verify correct functioning of the detector. Embodiments of the present invention provide a simplified way of verifying correct functioning of an arc fault/transient detector of an electrical power supply system using components inherent to the system itself and thereby avoiding removal of the detector from the system. This therefore reduces time required for maintenance of the electrical power supply system.

The inducing of such a transient current/voltage simulates what would happen in the event of an actual transient/arc fault. The ability of the detector to detect this induced transient current/voltage during the monitoring provides the ability to verify correct functioning of the detector. A failure of the detector to detect the induced transient current/voltage would be indicative of faulty functioning of the detector. The converse case would be that detection by the detector of the induced transient current/voltage would be indicative of the detector functioning correctly.

Embodiments of the invention are applicable for use on both direct current (dc) and alternating current (ac) power supply systems.

In an aspect, the selective switching of the test and breaker switches comprises successive steps of: 1) providing the breaker switch in its open position and the test switch in its closed position to thereby respectively i) break electrical continuity of the electrically conductive path and ii) provide electrical continuity of the short circuit loop to the ground and establish the short circuit; 2) thereafter switching the breaker switch to its closed position to provide electrical continuity of the electrically conductive path and inject a flow of current from the power source into the short circuit.

In an embodiment of the above aspect, the monitoring includes monitoring for a rate of change of either or both of a transient current or a transient voltage in the short circuit loop induced by step 2, wherein the condition corresponding to faulty functioning of the detector has the detector failing to detect the rate of change induced by step 2.

In an embodiment, the method includes a first predetermined time interval between commencing step 1 and commencing step 2, wherein the monitoring covers at least the duration of the first predetermined interval, wherein the condition corresponding to faulty functioning of the detector has the detector detecting the presence of a rate of change of current or voltage in the short circuit loop during the first predetermined time interval. The provision of the breaker switch in its open position (as in step 1) should mean that the system cannot induce transient currents/voltages into the short circuit loop. Consequently, a positive indication by the detector of an induced rate of change during this first predetermined time interval would be indicative of faulty functioning of the detector. By having the method of an embodiment of the invention incorporate this step, the method helps to diagnose the susceptibility of the detector causing nuisance trips resulting from sensing non-existent arc faults/transients.

In a further aspect of the invention, the method has a further step following step 2, the further step including: 3) switching the breaker switch to its open position to break electrical continuity of the electrically conductive path and terminate the injection of flow of current from the power source into the short circuit.

More particularly, in the above aspect of the invention, the monitoring includes monitoring for a rate of change of either or both of a transient current or a transient voltage in the short circuit loop induced by step 3, wherein the condition corresponding to faulty functioning of the detector has the detector failing to detect the rate of change induced by step 3.

In a still further aspect of the invention, the monitoring includes monitoring for a rate of change of either or both of a transient current or a transient voltage in the short circuit loop after elapsing of a second predetermined time interval commencing from the switching the breaker switch to its open position in step 3 and with the test switch remaining in its closed position, the second predetermined time interval having a duration corresponding to a duration for the decay of the rate of change (in current or voltage) induced by step 3. The condition corresponding to faulty functioning of the detector includes the detector detecting the presence of a rate of change of current or voltage in the short circuit loop after elapsing of the second predetermined time interval whilst the test switch remains in its closed position. In this aspect of the invention, after allowing for decay (over the second predetermined time interval) of the induced rate of change in current/voltage resulting from opening of the breaker switch in step 3, having the breaker switch in its open position should mean the system is incapable of inducing further transient currents/voltages into the short circuit loop. Consequently, a positive indication by the detector of an induced rate of change would be indicative of a faulty functioning of the detector. Performing the monitoring in this manner thereby helps to diagnose the susceptibility of the detector causing nuisance trips from picking up on non-existent arc faults/transients.

In an aspect of the invention, the method includes providing a user of the electrical power supply system with a report of the functional health of the detector based upon the functional status determined through the monitoring step of the method of the invention. The scope of who a "user" might be is unconstrained; however, by way of example only, where an embodiment of the invention is applied to power supply systems on aircraft, the user may include the pilot (or other(s) of the aircrew). It can therefore be seen that embodiments of the invention would allow an operational user to determine the functional status of the arc fault/transient detector during normal operation of the system(s) incorporating such a detector. By "operational user" is meant a user who is using (directly or indirectly) the electrical power supply system during normal operation (as opposed to during maintenance). However, embodiments of the present invention are equally applicable for use during maintenance; for example, where the user might be a maintenance technician.

In an embodiment of the invention, the selective switching of the test and breaker switches is repeated over two or more cycles. The repetition of the selective switching over multiple cycles would have the effect of increasing the statistical significance of the method and would provide a user of the system with greater confidence in the validity of the test results.

The method of embodiments of the invention have been trialled on a solid state power controller (SSPC), which incorporates the breaker switch, the test switch and the detector. When applied to an SSPC, in an embodiment, the SSPC has a current limit because the use of a current limit avoids the induced current flow resulting from the selective switching of the test and breaker switches rising too far and causing damage to the SSPC and other components of the system. However, the method of embodiments of the invention may still be applied to use with SSPC's without a current limit, although this would require more care be taken in the selective switching of the test and breaker switches to protect against the induced current rising too far and causing damage. Explaining further, the lack of a current limit in the SSPC would mean that after closing the breaker switch to inject a flow of current from the power source into the short circuit (as in steps (b) and 2 referred to above and recited in the claims), the breaker switch would have to be opened again very soon thereafter to protect against the induced current rising too far and causing damage. In contrast, the use of an SSPC with a current limit provides a user of the system with more flexibility and safety as it would overcome the issue of the induced current rising too far and causing damage.

In another aspect of the invention, there is provided an electrical power supply system, wherein the system includes a circuit having: a power source for providing electric power to a load; a breaker switch provided in an electrically conductive path between the power source and the load, the breaker switch having an open position and a closed position; and a test switch provided between an output of the breaker switch and a ground to form a short circuit loop in the circuit, the test switch having an open position for breaking electrical continuity of the short circuit loop to the ground and a closed position for providing electrical continuity of the short circuit loop to the ground; wherein the system further includes an arc fault/transient detector operable to monitor for a rate of change in one or both of a current or a voltage in the circuit, the detector co-operable with the breaker switch to trip the breaker switch from the closed position to the open position, if the sensed rate of change exceeds a predetermined value; the test and breaker switches being selectively switchable for: a) providing electrical continuity of the short circuit loop to the ground to thereby establish a short circuit between the output of the breaker switch and the ground, and thereafter either or both of: b) injecting a flow of current from the power source into the short circuit; and/or c) terminating an injected flow of current from the power source into the short circuit; the detector being operable to monitor for a rate of change of either or both of a transient current or a transient voltage in the short circuit loop induced by the injecting/terminating of the flow of current from the power source into the short circuit; wherein the system is operable to determine a functional status of the detector based upon the monitoring, wherein faulty functioning of the detector corresponds to the following condition being met: the detector failing to detect the induced rate of change during monitoring.

In an embodiment, the system is operable to provide an output signal to a user, reporting the functional status of the detector based upon the monitoring. The output signal may be in the form of an auditory or visual signal (or combination thereof). For example, the detector may include or be coupled to an output device. In an embodiment, the output device comprises one or both of a display screen and a speaker to provide a user of the system with an indication of the health of the detector.

BRIEF DESCRIPTION OF DRAWINGS

Embodiments of the invention are described with reference to the following accompanying drawings, which are intended to be non-limiting examples of the invention.

DETAILED DESCRIPTION

The description uses examples to disclose the invention and also to enable a person skilled in the art to make and use the invention. For the avoidance of doubt, the invention as defined in the claims may include within its scope other examples that occur to those skilled in the art which may differ from those examples indicated in the figures of this document.

Figure 1:
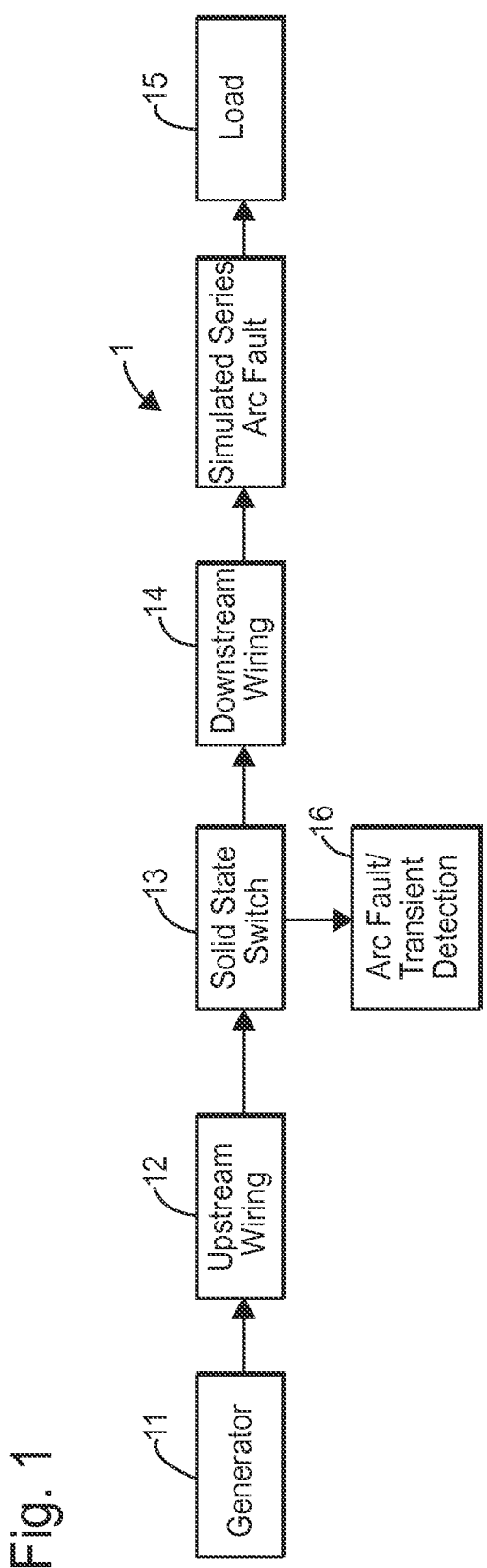
FIG. 1 shows a functional representation of various elements of an electrical power supply incorporating an arc fault/transient detector according to an embodiment of the invention.

FIG. 1 shows a representation of an electrical power supply system 1 in functional form. The system 1 is shown as including a generator 11 (referred to hereinafter as the "power source") electrically coupled by upstream wiring 12 to a solid state switch assembly 13, the solid state switch assembly 13 coupled by downstream wiring 14 to a load 15. The power source 11 functions to provide electric current to the load 15. Integrated with or coupled to the solid state switch assembly 13 is an arc fault/transient detector 16.

Figure 2:
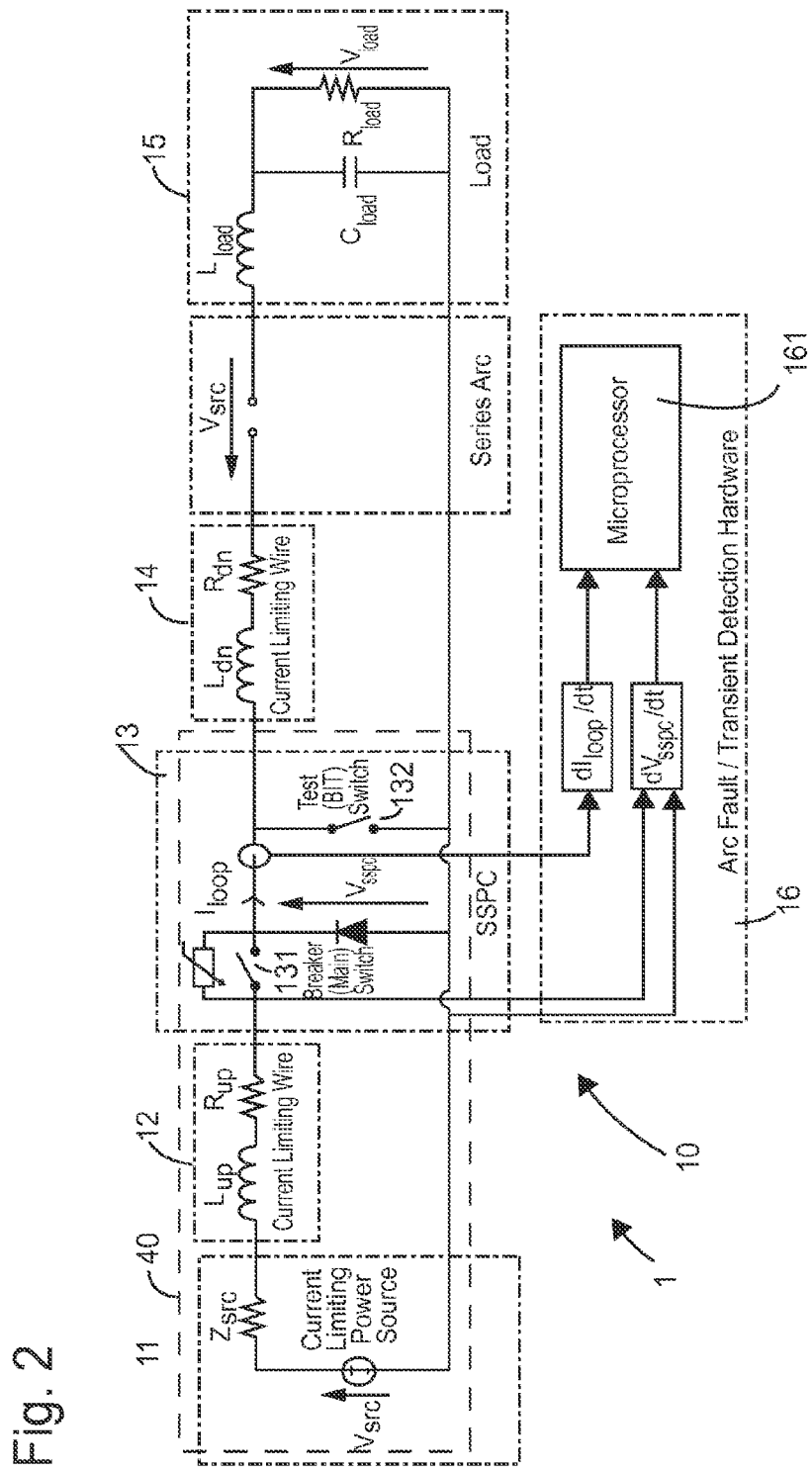
FIG. 2 corresponds to FIG. 1, but illustrates the electrical power supply system on a component level.

FIG. 2 shows a component level representation of the electrical power supply system 1. The electrical power supply system 1 is shown in the form of a circuit 10. The power source operates at a voltage $V_{src}$. The inductance and resistance of the upstream wiring 12 is indicated by $L_{up}$ and $R_{up}$ respectively. The solid state switch assembly 13 incorporates both a breaker switch 131 and a test switch 132. Coupled to the solid state switch assembly 13 is the arc fault/transient detector 16, with the detector containing a microprocessor 161. In the embodiment shown, the solid state switch assembly 13 and the detector 16 together form a solid state power controller (SSPC) which is integrated into the circuit 10. However, in an alternative embodiment, the arc fault/transient detector 16 may be a discrete device separate to, but electrically coupled to, the circuit 10. The upstream wiring 12 and downstream wiring 14 form an electrically conductive path between the power source 11 and the load 15, with the breaker switch 131 provided in the electrically conductive path. In the embodiment illustrated in the figures, the SSPC incorporates a current limit $I_{lim}$. As outlined in a preceding part of the description, the use of an SSPC having such a current limit constrains the magnitude of current flowing through the SSPC as a consequence of selective switching of the test and breaker switches, 132, 131.

Both of the breaker switch 131 and the test switch 132 have an open position and a closed position. The closed position of the breaker switch 131 ensures electrical continuity of the electrically conductive path from the power source 11, the upstream wiring 12 and the downstream wiring 14 to the load 15, with the open position of the breaker switch 131 breaking the electrical continuity of the electrically conductive path between the power source 11 and the load 15.

The test switch 132 is provided between an output of the breaker switch 131 and a ground to provide a short circuit loop in the circuit 10, the short circuit loop generally designated by 40. Although not shown in the figures of the example of the invention, the ground may be provided by casing of the SSPC. The closed position of the test switch 132 provides electrical continuity of the short circuit loop 40 to the ground, with the open position of the test switch 132 breaking the electrical continuity of the short circuit loop 40 to the ground.

The detector 16 taps current from a location downstream of the breaker switch 131 and taps voltage from upstream of the breaker switch 131.

One exemplary method is described below of verifying the correct functioning of the arc fault/transient detector 16. The method is described in relation to the components of the exemplary electrical power supply system 1 and circuit 10 shown in FIGS. 1 and 2. However, embodiment of the invention are not limited to use with a system having the specific configuration of the example shown in FIGS. 1 and 2, but may encompass use with any system falling within the scope of the claims.

In a first step (shown as step 1 on FIG. 3), the breaker switch 131 is provided in its open position and the test switch 132 is provided in its closed position, with the detector 16 tapping current and voltage from the locations shown in FIG. 2. This has the effects of: breaking the electrical continuity of the electrically conductive path between the power source 11 and the load 15 (due to the action of providing the breaker switch 131 in its open position); and providing electrical continuity of the short circuit loop 40 to the ground, so thereby establishing a short circuit between the output of the breaker switch 131 and the ground (due to the action of providing the test switch 132 in its closed position).

Figure 3:
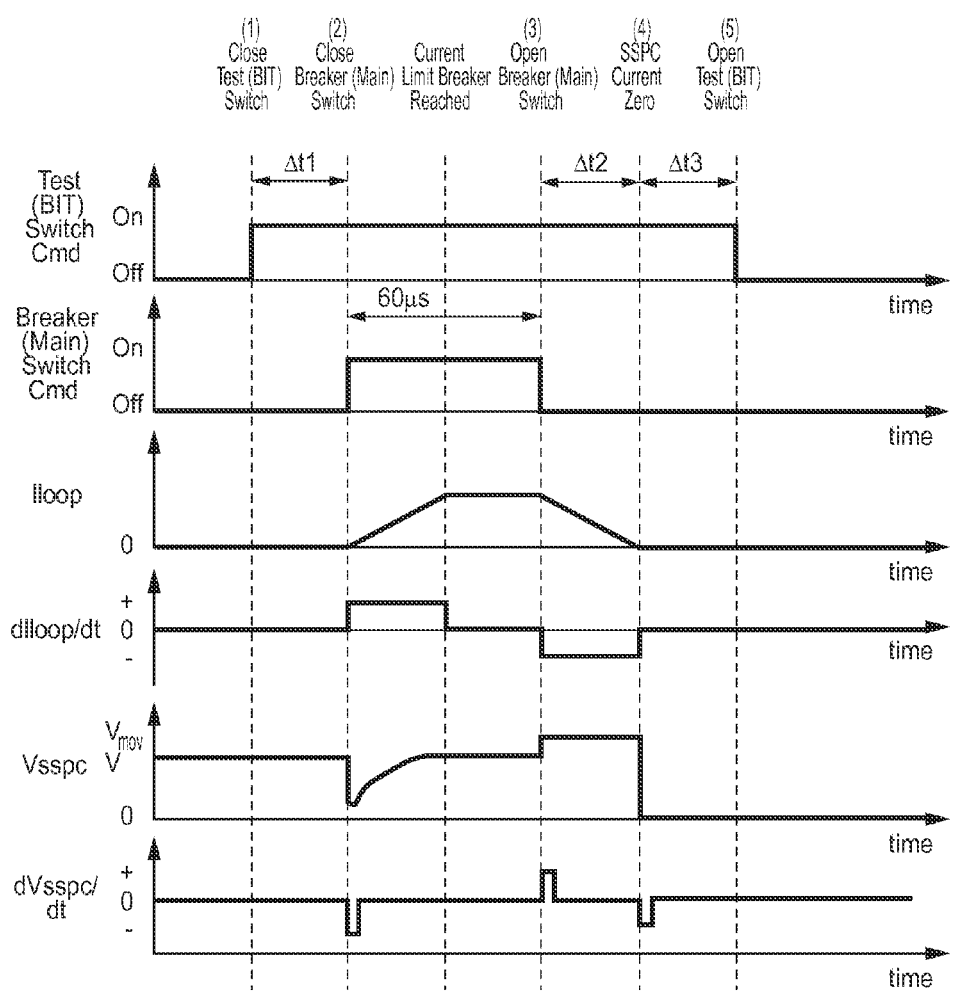
FIG. 3 shows predicted waveforms for current, voltage and rate of change of current and voltage for the system of FIG. 2.

After a first predetermined time interval (shown as Δt1 in FIG. 3), a second step is performed of closing the breaker switch 131. This second step is shown as step 2 on FIG. 3. Between the steps 1 and 2 the detector 16 monitors the tapped locations in the short circuit loop 40 for changes in current and voltage. The detector 16 in conjunction with operation of the processor 161 is able to measure and provide an output signal representing the magnitude and variation of the rate of change of current and voltage with time in the short circuit loop—these quantities are referred to as $dI_{loop}/dt$ and $dV_{sspc}/dt$, respectively. However, in the first predetermined time interval Δt1 between steps 1 and 2, the short circuit loop 40 and the detector 16 are isolated against the occurrence of any transient currents or voltages. Therefore, if the detector 16 happens to indicate the presence of a transient current/voltage occurring in this first predetermined time interval Δt1, it would be indicative of a fault with the functioning of the detector. Explaining further, this would indicate the detector 16 was vulnerable during normal operation of the system indicating the presence of an arc fault/transient in circumstances where no arc fault/transient should exist, and thereby causing erroneous tripping (i.e. "nuisance trips") of the breaker switch 131. Therefore, the monitoring of the detector 16 in this first predetermined time interval Δt1 between the start of step 1 and the start of step 2 helps to determine if a fault exists with the detector 16 which may lead to "nuisance trips" during normal operation to the system 1. FIG. 3 shows plots of the predicted variation in tapped current $I_{loop}$ and voltage $V_{sspc}$ and their respective rates of change $dI_{loop}/dt$, $dV_{sspc}/dt$, with the plots in the time interval Δt1 between steps 1 and 2 indicating a zero reading for rate of change in current and voltage. This zero reading is indicative of correct functioning of the detector 16 and therefore indicates good resilience of the detector 16 to causing "nuisance trips".

The closing of the breaker switch 131 in step 2 provides electrical continuity across the breaker switch 131, in effect closing the SSPC into the short circuit. The closing of the breaker switch 131 causes electric current to start flowing from the power source 11 into the short circuit to the ground. The current $I_{loop}$ in the short circuit loop should increase until reaching the current limit $I_{lim}$ of the SSPC, at which point $dI_{loop}/dt$ falls to zero; whereas the voltage $V_{sspc}$ initially has a negative rate of change $dV_{sspc}/dt$ until the line inductance of the upstream wiring 12 has been overcome and thereafter the voltage $V_{sspc}$ increases with a positive rate of change. As outlined in a preceding part of the description, the use of an SSPC with a current limit avoids the SSPC being damaged by high current flows induced through closing breaker switch 131 (and thereby the SSPC) into the short circuit. However, in an alternative embodiment, an SSPC without a current limit may be used; in this case, however, there would be a limitation as to how long the breaker switch 131 could be left closed to avoid the current rising too far and damaging the SSPC. Explaining further, the step of closing the breaker switch 131 would need to be followed quickly thereafter by a subsequent step of opening the breaker switch 131 to ensure the current levels do not rise too far.

The idealised (or predicted) rate of change $dI_{loop}/dt$ in current $I_{loop}$ occurring after the closing of the breaker switch 131 in step 2 can be expressed as:

$$\frac{dIloop}{dt} \cong \frac{Varc}{Lup}$$

The injection of current caused by the closing of the breaker switch 131 at the start of step 2 and the rate of change of the resulting induced current and voltage $dI_{loop}/dt$, $dV_{sspc}/dt$ simulate the effect of an arc fault/transient occurring during normal operation. The detector 16 continues to perform its monitoring function for changes in current and voltage after the closure of the breaker switch 131 of step 2. Detection of the current/voltage changes induced by this step 2 of closing the SSPC into the short circuit would be indicative of correct functioning of the detector 16. However, a failure to detect the presence of the induced current/voltage changes would be indicative of faulty functioning of the detector 16 and would indicate a risk of the detector 16 failing to trip the breaker switch 131 in the event of an actual arc fault/transient. Therefore, the monitoring function performed by the detector 16 after switching the breaker switch 131 to its closed position in step 2 helps to provide an indication as to whether the detector is likely to respond to counter any arc faults/transients occurring during normal operation of the system 1.

In a third step (shown as step 3 in FIG. 3), the breaker switch 131 is switched to its open position, thereby acting to terminate the injection of current from the power source. For the current-limited SSPC represented in the figures, the step 2 of closing the breaker switch 131 and the step 3 of opening the breaker switch may be in the region of 60 μs (as indicated on FIG. 3). The current $I_{loop}$ into the short circuit falls, but not instantaneously because of the line inductance of the upstream wiring 12. FIG. 3 shows a representation of the predicted changes in current $I_{loop}$ and voltage $V_{sspc}$ induced as a consequence of terminating the flow of current from the power source 11 through the action of switching the breaker switch 131 to its open position. The termination of the injection of current and the resulting changes in current and voltage in the short circuit loop which is induced by the opening of the breaker switch 131 in this step 3 simulates the effect of an arc fault/transient occurring during normal operation. The detector 16 continues to perform its monitoring function for changes in current and voltage after the opening of the breaker switch 131 of step 3. Detection of the induced current/voltage changes induced by this step 3 of opening the breaker switch 131 would be indicative of correct functioning of the detector 16. However, a failure to detect the presence of the induced current/voltage changes would be indicative of faulty functioning of the detector and would indicate a risk of the detector failing to trip the breaker switch 131 in the event of an actual arc fault/transient occurring during normal operation of the system 1. Therefore, the monitoring function performed by the detector 16 after switching the breaker switch 131 to its open position in step 3 helps to provide an indication as to whether the detector is likely to respond to counter any arc faults/transients occurring during normal operation.

A period of time after switching the breaker switch 131 into its open position, the induced changes in current and voltage should have decayed, i.e. there should be zero value of $dI_{loop}/dt$ and $dV_{sspc}/dt$. This period of time is referred to hereinafter as the second predetermined time interval $\Delta t2$ and is shown on FIG. 3. After lapse of the second predetermined time interval, there should be no changes in current or voltage occurring in the short circuit loop 40, with the breaker and test switches 131, 132 now being in their open and closed positions respectively. The detector 16 functions to monitor the current and voltage in the short circuit loop after lapse of the second predetermined time interval $\Delta t2$ with the breaker switch remaining in its open position from step 3—this is indicated on FIG. 3 as being the start of step 4. The detector 16 monitors for any change in current or voltage in the short circuit loop occurring from the commencement of step 4 until the test switch 132 is opened a period of time later (an event indicated on FIG. 3 as being step 5). In the period of time $\Delta t3$ between the start of step 4 and the start of step 5 in FIG. 3, the short circuit loop 40 and the detector 16 are isolated against the occurrence of any transient currents or voltages. Therefore, if the detector 16 detects the presence of a transient current/voltage occurring in this time interval $\Delta t3$, this would be indicative of a fault with the functioning of the detector. Explaining further, it would indicate the detector 16 was vulnerable during normal operation of the system indicating the presence of an arc fault/transient in circumstances where no arc fault/transient event should exist, and thereby causing erroneous tripping (i.e. "nuisance trips") of the breaker switch 131. Therefore, the monitoring of the detector 16 in the time interval $\Delta t3$ helps to determine if a fault exists with the detector 16 which may lead to "nuisance trips" occurring during normal operation of the system 1.

Figure 4:
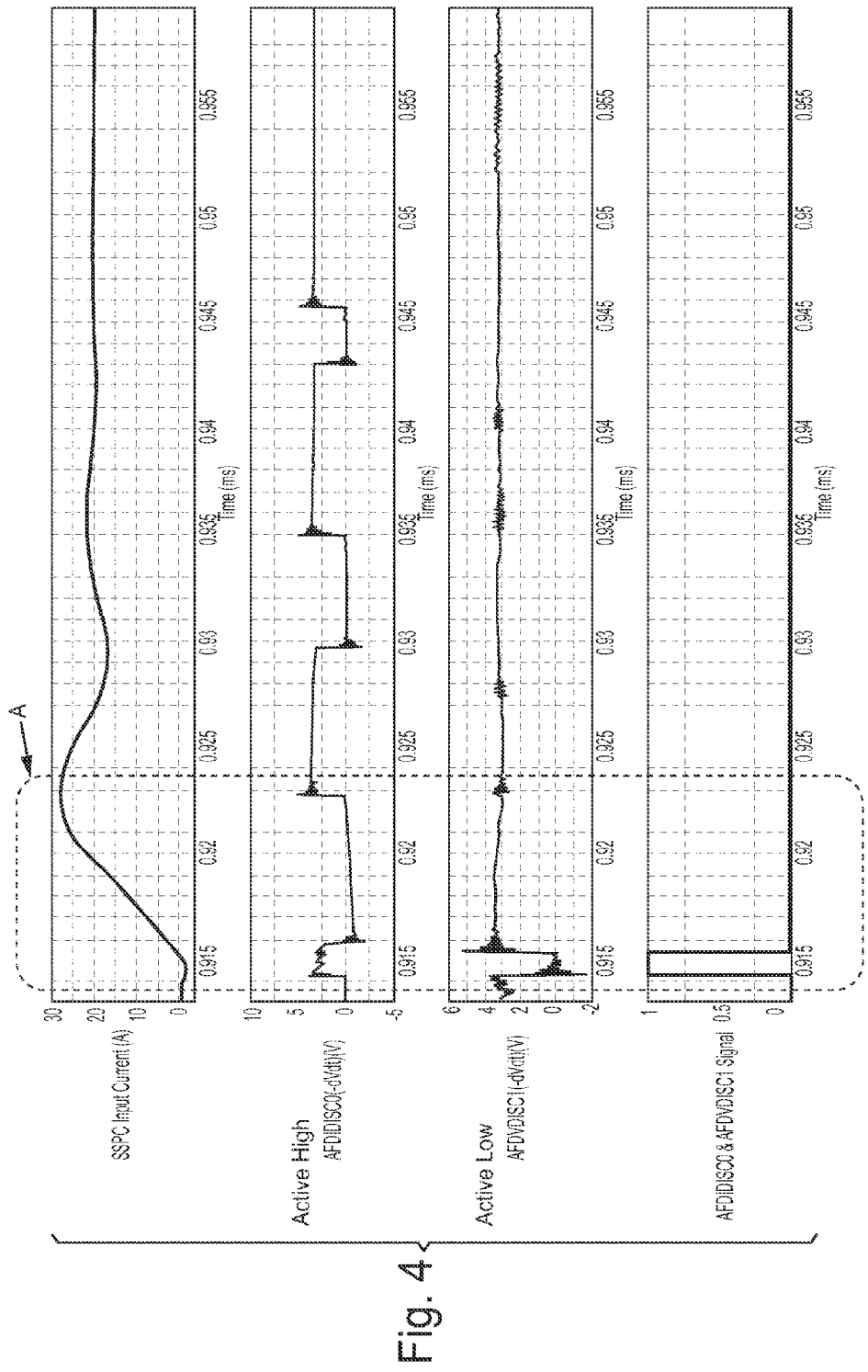
FIGS. 4 and 5 show experimentally derived measurement data of waveforms for rates of change of current and voltage as detected by the system of FIG. 2.
Figure 5:
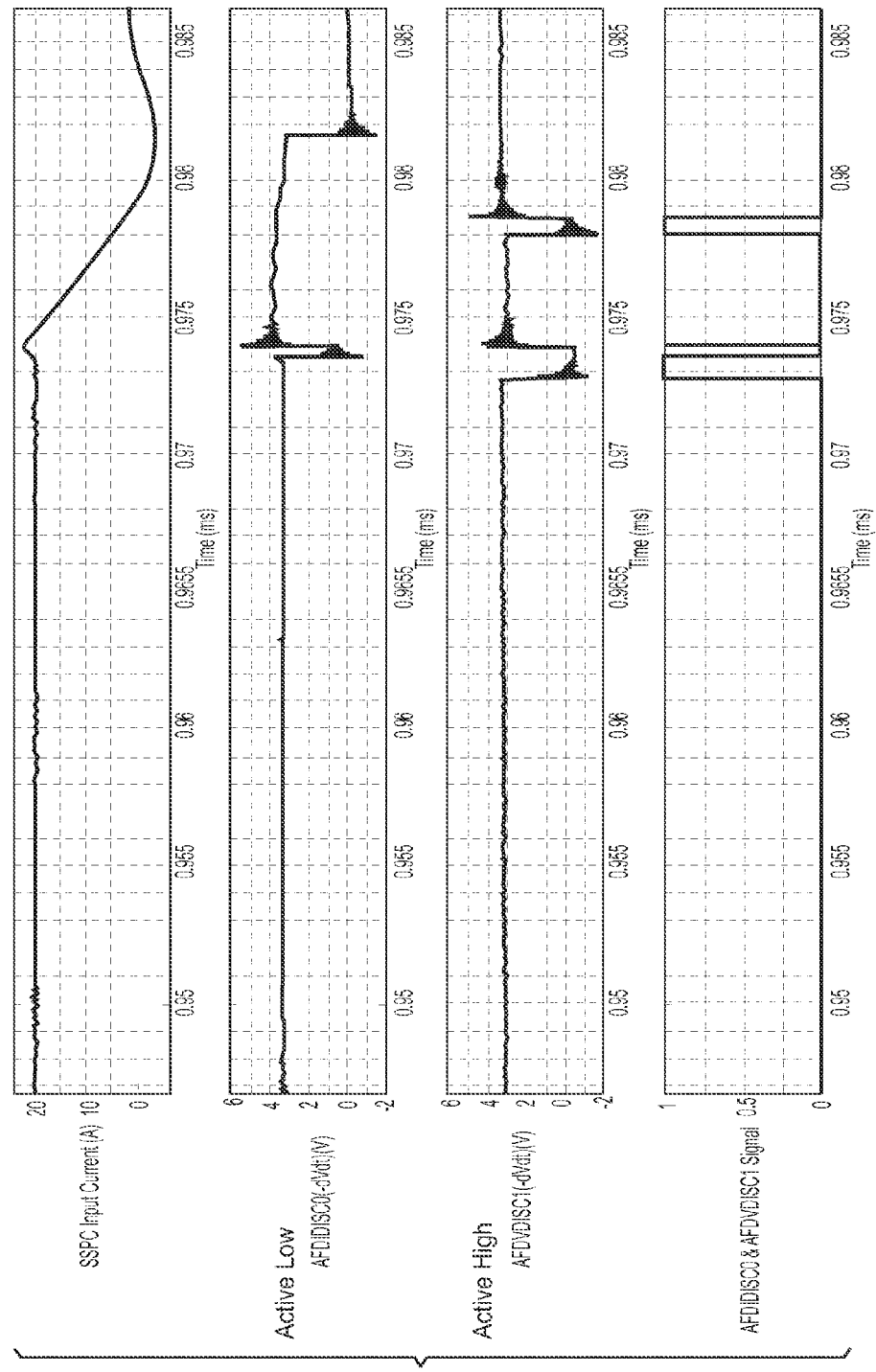

FIGS. 4 and 5 are experimental data derived from the testing of a circuit that corresponds to that of FIG. 2, where the SSPC current limit $I_{lim}$ is set to 20 Amps. FIGS. 4 and 5 are graphical plots of the rates of change of current and voltage for a rising edge current flow and a falling edge current flow into the short circuit, respectively. Considering FIG. 4, at time 0.915 ms the breaker switch 131 is closed to close the SSPC into the short circuit—this corresponds to step 2 as referred to above. As can be seen in the topmost plot in FIG. 4, there is a sharp rise in current flow until peaking at around 0.923 ms, with the current-limiting construction of the SSPC constraining the magnitude of the rise in current. However, FIG. 4 shows that upon reaching the current limit at 0.923 ms, the current then oscillates and decays in an exponential manner (an effect called current "ringing"). The ringing occurring after 0.923 ms can still trigger detection by the detector 16 (see the response occurring in the plots of dV/dt and dI/dt occurring after 0.923 ms). However, it is the response of the detector 16 between 0.915 ms and 0.923 ms which is of interest in FIG. 4 (indicated as region A in FIG. 4)—this figure shows the detector having recorded a rate of change in current and voltage, thereby indicating correct operation of the detector 16. FIG. 5 shows the response of the detector 16 to a falling edge current flow into the short circuit, with the response curves between 0.974 ms and 0.981 ms being of interest.

Although not shown in the figures, the detector 16 incorporates a means of detecting a rate of change of transient current $dI_{loop}/dt$ induced into the short circuit loop as a consequence of the injecting or terminating of the flow of current from the power source into the short circuit. Examples of such current detectors include, but are not limited to, Rogowski coils, shunt resistors and amplifiers. The exemplary electrical power supply system 1 illustrated in the figures shows the detector tapping the voltage $V_{sspc}$ from before (i.e. upstream of) the breaker switch 131 in order to monitor for the rate of change in a transient voltage induced into the short circuit loop as a consequence of the injecting or terminating of the flow of current from the power source into the short circuit. However, the same functionality can be provided by tapping the voltage $V_{sspc}$ from after (i.e. downstream of) the breaker switch 131. Tapping the voltage from upstream of the breaker switch results in the magnitude of the change in voltage being less than tapping the voltage $V_{sspc}$ from downstream of the breaker switch.

Although not shown in the figures, the system 1 may include or be coupled to an output device for providing a user of the system 1 with a report of the health of the detector 16 based upon the results of the monitoring outlined above. In one embodiment, the output device would include either or both of a display screen and/or a speaker to provide a user of the system with an indication of the health of the detector 16.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural element with insubstantial differences from the literal languages of the claims.

What is claimed is:

1. A method of verifying correct functioning of an arc fault/transient detector, the method comprising:
   providing an electrical power supply system, which includes:
      a circuit having:
         a power source for providing electric power to a load;
         a breaker switch provided in an electrically conductive path between the power source and the load, the breaker switch having an open position, a closed position, and an output; and
         a test switch provided between the output of the breaker switch and a ground to form a short circuit loop in the circuit, the test switch having an open position for breaking electrical continuity of the short circuit loop to the ground and a closed position for providing electrical continuity of the short circuit loop to the ground; and an arc fault/transient detector operable to monitor for a rate of change in one or both of a current or a voltage in the circuit, the detector co-operable with the breaker switch to trip the breaker switch from the closed position to the open position if the sensed rate of change exceeds a predetermined value;

selectively switching the test and breaker switches so as to:
(a) provide electrical continuity of the short circuit loop to the ground thereby establishing a short circuit between the output of the breaker switch and the ground, and thereafter either or both of:
(b) inject a flow of current from the power source into the short circuit; and/or
(c) terminate an injected flow of current from the power source into the short circuit;

monitoring, using the arc fault/transient detector, a rate of change of either or both of a transient current or a transient voltage in the short circuit loop induced by the injecting/terminating of the flow of current from the power source into the short circuit; and determining a functional status of the detector based upon the monitoring, wherein faulty functioning of the detector corresponds to the following condition being met: the detector failing to detect the induced rate of change during the monitoring.

2. The method of claim 1, wherein the method further comprises providing a user of the electrical power supply system with a report of a functional health of the detector based upon the functional status determined through the monitoring.

3. The method of claim 2, wherein the electrical power supply system is provided on an aircraft and the user is one or more of: a pilot or other member of an aircrew of the aircraft; and maintenance staff.

4. The method of claim 1, wherein the selective switching of the test and breaker switches comprises the successive steps of:
(i) providing the breaker switch in its open position and the test switch in its closed position to thereby respectively (A) break electrical continuity of the electrically conductive path and (B) provide electrical continuity of the short circuit loop to the ground and establish the short circuit;
(ii) thereafter switching the breaker switch to its closed position to provide electrical continuity of the electrically conductive path and inject a flow of current from the power source into the short circuit.

5. The method of claim 4, wherein the monitoring comprises monitoring for a rate of change of either or both of a transient current or a transient voltage in the short circuit loop induced by step (ii); wherein faulty functioning of the detector corresponds to the detector failing to detect the rate of change induced by step (ii).

6. The method of claim 4, wherein the selective switching of the test and breaker switches further comprises a first predetermined time interval between commencing step (i) and commencing step (ii), wherein the monitoring covers at least the duration of the first predetermined interval, wherein faulty functioning of the detector corresponds to the detector detecting the presence of a rate of change of current or voltage in the short circuit loop during the first predetermined time interval.

7. The method of claim 4, wherein the selective switching of the test and breaker switches further comprises, following step (ii):

(iii) switching the breaker switch to its open position to break electrical continuity of the electrically conductive path and terminate the injection of flow of current from the power source into the short circuit.

8. The method of claim 7, wherein the monitoring comprises monitoring for a rate of change of either or both of a transient current or a transient voltage in the short circuit loop induced by step (iii), wherein faulty functioning of the detector corresponds to the detector failing to detect the rate of change induced by step (iii).

9. The method of claim 7, wherein the monitoring comprises monitoring for a rate of change of either or both of a transient current or a transient voltage in the short circuit loop after elapsing of a second predetermined time interval commencing from switching the breaker switch to its open position in step (iii) and with the test switch remaining in its closed position, the second predetermined time interval having a duration corresponding to a duration for the decay of the rate of change induced by step (iii), wherein faulty functioning of the detector corresponds to the detector detecting the presence of a rate of change of current or voltage in the short circuit loop after elapsing of the second predetermined time interval whilst the test switch remains in its closed position.

10. The method of claim 1, wherein the detector is integrated into the circuit.

11. The method of claim 1, wherein the detector is a solid state power controller and comprises the breaker switch, the test switch and the detector, wherein the solid state power controller has a current limit.

12. The method of any of the preceding claims, wherein the power source comprises one or both of a direct current (DC) power source and an alternating current (AC) power source.

13. An electrical power supply system comprising:
a circuit including:
a power source for providing electric power to a load;
a breaker switch provided in an electrically conductive path between the power source and the load, the breaker switch having an open position, a closed position, and an output; and
a test switch provided between the output of the breaker switch and a ground to form a short circuit loop in the circuit, the test switch having an open position for breaking electrical continuity of the short circuit loop to the ground and a closed position for providing electrical continuity of the short circuit loop to the ground;
an arc fault/transient detector operable to monitor for a rate of change in one or both of a current or a voltage in the circuit, the detector co-operable with the breaker switch to trip the breaker switch from the closed position to the open position if the sensed rate of change exceeds a predetermined value;
wherein the test and breaker switches are selectively switchable for:
(a) providing electrical continuity of the short circuit loop to the ground to thereby establish a short circuit between the output of the breaker switch and the ground, and thereafter either or both of:
(b) injecting a flow of current from the power source into the short circuit; and/or
(c) terminating an injected flow of current from the power source into the short circuit;
wherein the detector is operable to monitor a rate of change of either or both of a transient current or a transient voltage in the short circuit loop induced by the injecting/terminating of the flow of current from the power supply into the short circuit;

wherein the system is operable to determine a functional status of the detector based upon the monitoring, wherein faulty functioning of the detector corresponds to the detector failing to detect the induced rate of change during monitoring.

14. The system of claim 13, wherein the system comprises an output device coupled to or integrated with the detector and operable to provide a user of the electrical power supply system with a report of a functional health of the detector based upon the functional status determined through the monitoring.

15. The system of claim 14, wherein the output device comprises one or both of a display screen and a speaker.

16. The system of claim 13, wherein the detector is integrated into the circuit.

17. The system of claim 13, wherein the detector is a solid state power controller and comprises the breaker switch, the test switch and the detector, wherein the solid state power controller has a current limit.

18. The system of claim 13, wherein the power source comprises one or both of a direct current (DC) power source and an alternating current (AC) power source.

* * * * *